United States Patent

Cobb et al.

[11] Patent Number: 5,648,005
[45] Date of Patent: *Jul. 15, 1997

[54] MODIFIED QUARTZ PLATE TO PROVIDE NON-UNIFORM LIGHT SOURCE

[75] Inventors: Joshua Monroe Cobb, Millbrook, N.Y.; Peter Kevin Parker, Urbana, Ill.

[73] Assignee: International Business Machines Corporation, Armonk, N.Y.

[*] Notice: The term of this patent shall not extend beyond the expiration date of Pat. No. 5,532,457.

[21] Appl. No.: 618,055

[22] Filed: Mar. 25, 1996

Related U.S. Application Data

[60] Continuation of Ser. No. 477,065, Jun. 7, 1995, Pat. No. 5,532,457, which is a division of Ser. No. 263,977, Jun. 22, 1994.

[51] Int. Cl.$^6$ .................... B23K 1/005; F27D 11/00
[52] U.S. Cl. .................... 219/411; 219/405; 219/85.13; 250/492.2; 392/416
[58] Field of Search .................... 219/405, 411, 219/85.12, 85.13; 392/416, 418, 411, 423, 424; 250/492.2; 118/724, 725

[56] References Cited

U.S. PATENT DOCUMENTS

| | | | |
|---|---|---|---|
| 3,283,124 | 11/1966 | Kawecki | 219/347 |
| 3,586,813 | 6/1971 | Cruickshank et al. | 219/85 |
| 3,632,955 | 1/1972 | Cruickshank et al. | 219/85 |
| 3,718,800 | 2/1973 | Costello | 219/85 |
| 3,805,019 | 4/1974 | Gorishek | 219/349 |
| 4,160,893 | 7/1979 | Meyen et al. | 219/85 |
| 4,188,533 | 2/1980 | Ashenfelter et al. | 250/388 |
| 4,278,867 | 7/1981 | Tan | 219/121 |
| 4,755,654 | 7/1988 | Crowley et al. | 219/405 |
| 4,785,156 | 11/1988 | Benko et al. | 219/121.64 |
| 4,960,972 | 10/1990 | Nakamura et al. | 219/85.12 |
| 5,196,667 | 3/1993 | Gammelin | 219/85.12 |
| 5,219,520 | 6/1993 | Brofman et al. | 419/35 |
| 5,284,286 | 2/1994 | Brofman et al. | 228/19 |
| 5,299,279 | 3/1994 | Roberts | 392/421 |
| 5,302,230 | 4/1994 | Ino et al. | 156/603 |

FOREIGN PATENT DOCUMENTS

| | | |
|---|---|---|
| 55-110832 | 8/1980 | Japan . |
| 60-161616 | 8/1985 | Japan . |

OTHER PUBLICATIONS

IBM Technical Disclosure Bulletin, (Bickford, et al.), vol. 20, No. 6, pp. 2141–2142, (Nov. 1977).
Brofman, et al., "Interconnect Technology Utilized in Recent IBM Thermal Conduction Modules", Journal fo Surface Mount Technology, vol. 6, Issue 2, (Apr. 1993).
Puttlitz, et al., "Replacing Flip Chips on MLC Multichip Modules Using Focused Infrared (IR): The Basics", ISHM '92 Proceedings, pp. 384–390 (Oct. 1992).

Primary Examiner—Teresa J. Walberg
Assistant Examiner—J. Pelham
Attorney, Agent, or Firm—Aziz M. Ahsan

[57] ABSTRACT

The present invention relates generally to a new apparatus and method for providing a non-uniform light source. More particularly, the invention encompasses an apparatus that uses a modified quartz plate to provide a non-uniform light source. A method for such a non-uniform light source using a modified quartz plate is also disclosed.

9 Claims, 1 Drawing Sheet

MODIFIED QUARTZ PLATE TO PROVIDE NON-UNIFORM LIGHT SOURCE

CROSS-REFERENCE TO RELATED PATENT APPLICATIONS

This patent application is a continuation of U.S. patent application Ser. No. 08/477,065, filed on Jun. 7, 1995, which has issued as U.S. Pat. No. 5,532,457, on Jul. 2, 1996, and which was a divisional of U.S. patent application Ser. No. 08/263,977, filed on Jun. 22, 1994.

FIELD OF THE INVENTION

The present invention relates generally to a new apparatus and method for providing a non-uniform light source. More particularly, the invention encompasses an apparatus that uses a modified quartz plate to provide a non-uniform light source. A method for such a non-uniform light source using a modified quartz plate is also disclosed.

BACKGROUND OF THE INVENTION

Semiconductor devices are becoming smaller and more dense with the evolution of new technology. However, increases in circuit density produce a corresponding increase in overall chip failure rates at a time when chip failure rates must decrease to remain competitive. Chip manufacturers are therefore challenged to improve the quality of their products by identifying and eliminating defects which produce defective chips known as fails. Whereas significant improvements are being made to eliminate systematic defects by reducing process variability. Process improvements alone are not sufficient to eliminate all the random defects which effect both yield and reliability. Historically, screening techniques have been employed to improve product failure rates to acceptable levels by culling out many of these random defects.

Single chip or multi-chip packaging strategies require the ability to join or replace individual chips from an assembled chip module. This should of course be done without altering the integrity of the remaining chips or capacitors or other electronic components. Chip changing is also required for yield management, upgrade capability, and engineering changes, to name a few. Chip replacement typically involves three distinct steps: chip removal, chip site solder dress, and new chip rejoin. Different tools and processes are used in the chip removal or chip join process.

U.S. Pat. No. 3,283,124 (Kawecki), discloses a selective heating apparatus where energy from an infrared source is focused through the use of a special focusing means.

U.S. Pat. No. 4,160,893 (Meyen et al.) discloses an individual chip joining machine, where an IR lamp is used to heat the upper surface of a chip through a flat quartz plate.

U.S. Pat. No. 4,278,867 (Tan) discloses a system for chip joining by short wavelength radiation. Tan uses a laser to heat the upper or back-side surface of a chip during the process.

IBM Technical Disclosure Bulletin, "Luminous Dual Reflection Lamp" Vol. 20, No. 6, Pages 2141–2142 (November 1977), discloses a lighting system for uniformly scattering light without projecting either characteristic central hot spots or concentrated filament images. This is achieved by using a flat clear quartz plate, having a reflecting convex portion and a concave reflector.

Puttlitz, et al., "Replacing Flip Chips on MLC Multichip Modules Using Focused Infrared (IR): The Basics", ISHM '92 Proceedings, Pages 384–390 (October 1992), discloses a means of locally heating a target chip, site dressing the chip site, and placing and reflowing a replacement chip. This is done by using an infrared (IR) quartz-halogen lamp within a metal reflector housing. The IR lamp is typically located at or near the parabolic reflector focal point so that its energy can be directed and focused onto the backside of the target chip. Heating can, however, be confined to the target chip by introducing a substrate shield that prevents irradiating the surrounding MCM surface and attachments. This assures that only the target chip is irradiated (i.e., heated) when the IR lamp is energized.

PURPOSES AND SUMMARY OF THE INVENTION

The invention is a novel method and an apparatus for providing a non-uniform light source.

Therefore, one purpose of this invention is to provide an apparatus and a method that uses a modified quartz plate to produce a non-uniform light source.

Another purpose of this invention is to provide a non-uniform light source using a modified quartz plate.

Therefore, in one aspect this invention comprises a process for providing non-uniform heat to at least one surface of at least one electronic component comprising:

(a) a quartz plate, wherein at least a portion of at least one surface of said quartz plate has a concave surface, (b) an IR source to provide heat to said at least one surface of said electronic component, (c) wherein at least a portion of the heat from said IR source is passed through at least a portion of said concave surface towards a portion of said at least one surface of said electronic component such that said surface gets non-uniform exposure of said heat.

In another aspect this invention comprises a process for removing electronic components from a substrate or joining electronic components to a substrate comprising:

(a) a quartz plate, wherein at least a portion of at least one surface of said quartz plate has a concave surface, (b) an IR source to provide heat to the upper surface of said electronic component, (c) wherein at least a portion of the heat from said IR source is passed through at least a portion of said concave surface towards a portion of the upper surface of said electronic component such that said upper surface gets non-uniform exposure of said heat, and wherein said electronic component is heated to sufficient level to reflow any electrical connection between said electronic component and said substrate, and thereby said electronic component is either, removed from said substrate or joined to said substrate.

In yet another aspect this invention comprises an apparatus for providing non-uniform heat to at least one surface of at least one electronic component, comprising:

(a) an IR source to provide heat to said at least one surface of said electronic component, (b) a quartz plate, wherein at least a portion of at least one surface of said quartz plate has a concave surface, (c) wherein heat from said IR source is passed to said at least one surface of said electronic component in a non-uniform manner through at least a portion of said concave surface.

In still yet another aspect this invention comprises an apparatus for removing an electronic component from a substrate or joining an electronic component to a substrate, comprising:

(a) an IR source to provide heat to remove said electronic component from said substrate, (b) a quartz plate, wherein at least a portion of at least one surface of said quartz plate has a concave surface, (c) wherein heat from said IR source is passed to the upper surface of said electronic component in a non-uniform manner through at least a portion of said concave surface, such that said heat reflows the electrical interconnections between said electronic component and said substrate, and thereby said electronic component is either removed from said substrate or joined to said substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
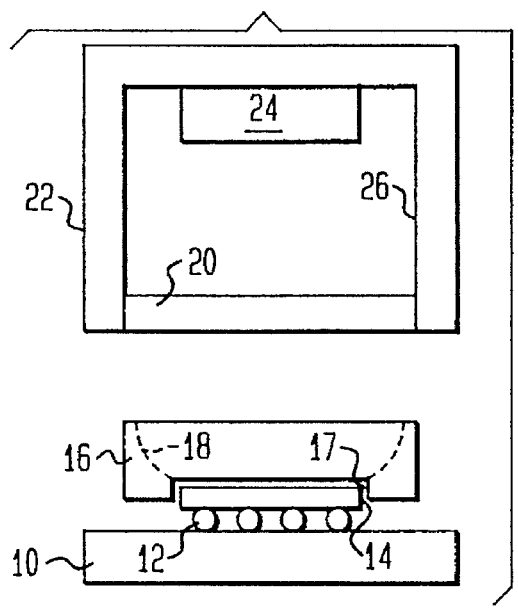
FIG. 1A, illustrates one prior art method of heating and removing a chip from a substrate.

FIG. 1A, illustrates one prior art method of heating and removing an electronic component 14, such as an integrated circuit chip or capacitor 14, from a module or a substrate 10, or heating and joining an electronic component 14, such as an integrated circuit chip or capacitor 14, to a module or a substrate 10. For the purposes of illustration only the method of chip removal will be discussed in detail, but it should be understood that the same tool and method can be used in reverse to join a chip or electronic component 14, to a module 10. The chip 14, is typically secured to the substrate or module 10, through a plurality of electrical connections 12, such as, for example, solder balls or solder columns or C4 (Controlled Collapse Chip Connections) 12. C4 is a Trademark of International Business Machines Corporation, Armonk, New York, USA.

When there is a need to remove the chip 14, from the substrate 10, a variety of methods well known in the art could be used. One such method and apparatus is shown in FIG. 1A. The apparatus has a chip removal probe 16, that has a bowl shaped surface 18, and an opening 17, to snugly fit over the chip or similar such device 14. The chip 14, to be removed is first heated, by methods well known in the art, so that the solder material in the solder balls 12, reaches its liquidus state. One way of doing this would be to use an IR (infrared) source 24, that is contained within a housing 22. The housing 22, could also have a quartz plate 20, that basically is used to protect the light source 24. The housing 22, could also have a coating of a reflective material 26, to reflect the IR energy being emitted from the IR source 24, towards the quartz plate 20.

Typically, the chip removal probe 16, is made to contact the electronic component 14, such that the electronic component 14, snugly and securely fits into the opening 17. The IR source is then turned on and the solder balls 12, are melted by directing the thermal heat through the quartz plate 20, onto the upper surface of the chip 14. Once the solder balls 12, reach the liquidus state the removal probe 16, is moved such that the probe 16, carries the chip 14, with it.

The left-over solder on the chip 14, or the substrate 10, can be subsequently removed by method well known in the art. Such as, for example, by using the invention of U.S. Pat. No. 5,219,520 (Brofman et al.) or U.S. Pat. No. 5,284,286 (Brofman et al.), which are assigned to the assignee of the instant Patent Application, and the disclosure of which is incorporated herein by reference.

Figure 1B:
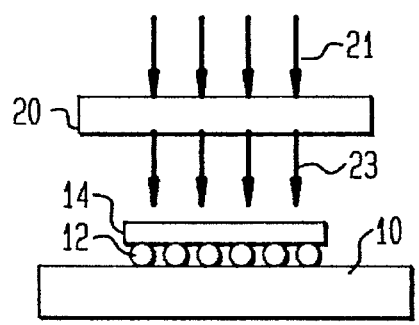
FIG. 1B, illustrates another prior art method of heating and removing a chip from a substrate.

As more clearly seen in FIG. 1B, which is another prior art method of heating and removing an electronic component 14, such as a chip or a capacitor 14, from a substrate or module 10, the inbound rays 21, from the IR source 24, pass through the quartz plate 20, as outbound rays 23, and heat the electronic component 14. The quartz plate 20, that is used in the prior art process is a very flat clear quartz plate, that allows for the maximum light to pass through, and as such the inbound rays 21, and the outbound rays 23, follow a straight line path, i.e., the outbound rays 23, do not exit the quartz plate 20, at an angle. When such a process and apparatus is used it uniformly provides heat to the upper surface of the electronic component 14, but it has been found that through this process the chip internally gets heated more in the center and cannot dissipate the heat fast because the surface area at the periphery is also being exposed to the same amount of heat. This heat in the center of the electronic component 14, creates unnecessary thermal gradients and stresses and in some cases it reduces the useful life of the electronic components 14. In other words, the electronic component 14, being heated does not spatially dissipate the heat evenly. Therefore, when a uniform area of heat is applied to the upper surface of the electronic component 14, the thermal gradients along the electronic component 14, are not uniform. However, the inventive method and apparatus of this invention overcomes this and other problems.

Figure 2A:
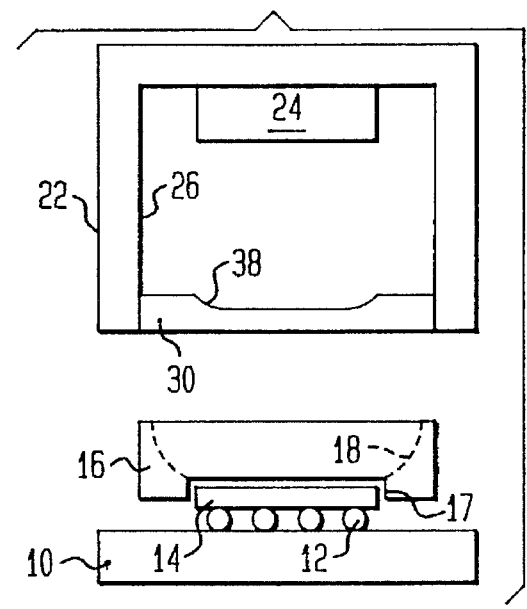
FIG. 2A, illustrates a preferred embodiment of this invention.

FIG. 2A, illustrates a preferred embodiment of this invention for removal of an electronic component 14, from a substrate 10. The process and apparatus is very similar to the one known in the prior art and discussed in FIGS. 1A and 1B, however the major difference is in the inventive quartz plate 30. At least a portion of the quartz plate 30, has a concave surface 38. As more clearly seen in FIG. 2B, this concave surface 38, allows the inbound light energy 21, to exit the quartz plate 30, in a dispersed manner, such as outbound energy rays 33. The rays 33, then strike and heat the upper surface of the chip 14, in a non-uniform matter. But because the surface heat is in a non-uniform manner, it has been found that internally the chip 14, does not have a thermal gradient and therefore the solder balls 12, melt or reflow in a uniform manner. The radius of curvature of the concave surface 38, depends upon the amount of heat that is needed to non-uniformly heat the upper surface of the chip 14, so that internally the chip 14, has a uniform heat flow.

Figure 2B:
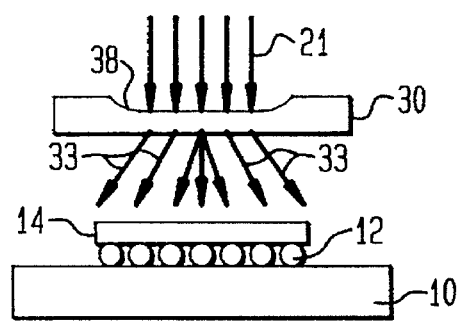
FIG. 2B, illustrates another preferred embodiment of this invention.

FIG. 2B, illustrates another preferred embodiment of this invention for removal of a chip 14, from a substrate 10. Here the solder material 12, of the chip 14, is being reflowed without the aid of the chip removal probe 16, and therefore once the solder 12, has melted the chip 14, can be separated from the substrate 10, by any method known in the art.

The use of the chip removal probe 16, provides two major advantages in the chip 14, removal process. The first is that it insures that the IR energy 23 or 33, that is outside the opening 17, or outside the peripheral surface of the chip 14, is either absorbed by the surface 18, or is reflected off the surface 18. The second advantage is the fact that the probe 16, can itself be used to separate the chip 14, from the substrate 10.

Figure 3:
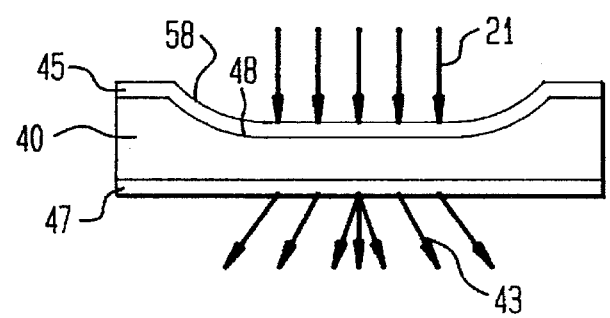
FIG. 3, illustrates yet another preferred embodiment of this invention.

FIG. 3, illustrates yet another preferred embodiment of the invention. A quartz plate 40, has a concave surface 48, which could be the same or similar to the concave surface 38, or it could be different. The quartz plate 40, has a thin film or coating of an anti-reflection coating 45 and 47, on the upper and lower surfaces of the quartz plate 40. The coatings 45 and 47, could be of the same material or a different material. It is preferred that the thickness of the coatings 45 and 47, are just sufficient to provide the optimum anti-reflection coating. The material for the coatings 45 and 47, are well known in the art of optical interference science. But, again the coatings that are preferred to be used with this invention are coatings that provide more transmission of the inbound light energy 21, so that the outbound light energy 43, contains more energy than would be available if the coatings 45 and 47, were not on the quartz plate 40. The coating 45, produces a concave surface 58, for the quartz plate 40. It is preferred that the addition of the coating 45, producing the concave surface 58, over the concave surface 48, does not have any adverse impact on the outbound energy 43.

Substrate damage can be minimized during the chip removal or chip join process by heating the solder balls above the solder liquidus and then removing the chip. Care must also be taken to avoid melting solder joints of adjacent electronic components, such as, capacitors or chips, to name a few, as well as the TCM (Thermal Conduction Module) pin-attachment solder. This can be accomplished by focusing the IR energy onto the back side of the chip and precisely controlling the process. Once the solder is molten, a vacuum probe could be used to remove the chip from its substrate. After the chip removal the residual solder at the chip site can be removed by methods well known in the art, and the chip site can be site dressed. Once the chip site has been site-dressed a replacement chip can now be easily joined to the substrate. Rejoin of a new chip is accomplished by fluxing the dressed site, placing and reflowing the chip onto the module using conditions identical to those used for the initial chip attachment process. One way of course would be to use the apparatus of either FIG. 2A or FIG. 2B, which would now be used to non-uniformly heat the backside of the chip and to allow the reflow of the solder. After the solder has been reflowed the IR source is turned off and the solder is allowed to solidify so that a good solder bond between the chip and the substrate is obtained.

For the purposes of illustration only the invention and the prior art has been discussed with reference to a chip joining to a substrate and chip removal from a substrate. However, the inventive quartz plate 30 or 40, could be used for any application that requires non-uniform light source on the surface, so that the item being heated has internally a minimum or negligible thermal gradient.

For most applications at least a portion of one surface of the quartz plate 30 or 40, is concave, but for some applications both surfaces could be concave as long as the heat or energy being projected on the upper or one surface of the electronic component is non-uniform. As stated earlier the electronic component being heated only has its edges and the opposite surface to dissipate the thermal energy and so by providing an opposite or non-uniform thermal gradient at the surface of the component results in a uniform thermal distribution internally.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for removing an electronic component from a substrate or joining an electronic component to a substrate, wherein non-uniform IR radiation is transmitted onto a surface of said electronic component, generating therein uniformly distributed thermal energy which is transmitted through said electronic component, comprising:

(a) an IR source to provide non-uniform IR radiation to said electronic component, (b) a quartz plate, wherein at least a portion of at least one surface of said quartz plate has a concave surface, and wherein said non-uniform IR radiation is transmitted to a surface of said electronic component only through said concave portion of said quartz plate, (c) wherein non-uniform IR radiation from said IR source is passed to the upper surface of said electronic component in a non-uniform manner through at least a portion of said concave surface, such that said electronic component transmits said non-uniform IR radiation as uniform thermal energy and wherein said uniform thermal heat reflows the electrical interconnections between said electronic component and said substrate, and thereby said electronic component is either removed from said substrate or Joined to said substrate.

2. The apparatus of claim 1, wherein at least 50 percent of said quartz plate has a concave surface.

3. The apparatus of claim 1, wherein said quartz plate and said IR source are secured to a housing.

4. The apparatus of claim 1, wherein said electronic component is a chip or a capacitor.

5. The apparatus of claim 1, wherein said non-uniform radiation is used to either remove said electronic component from a substrate or to join said electronic component to a substrate by non-uniformly radiating said electronic component to a sufficient level to reflow any electrical connection between said electronic component and said substrate, and thereby said electronic component is either removed from said substrate or joined to said substrate.

6. The apparatus of claim 5, wherein said substrate is selected from a group comprising a single-layered ceramic substrate, a multilayered ceramic substrate or a glass-ceramic substrate.

7. The apparatus of claim 5, wherein said electrical connection between said electronic component and said substrate is selected from a group comprising solder ball, solder column or controlled collapse chip connections.

8. The apparatus of claim 1, wherein a probe is inserted between said quartz plate and said electronic component and is made to contact the peripheral edges of said electronic components to securely hold said electronic component.

9. The apparatus of claim 1, wherein at least one surface of said quartz plate has at least one coating of at least one anti-reflection material.

* * * * *